US008735198B2

(12) United States Patent
O'Mahony et al.

(10) Patent No.: US 8,735,198 B2
(45) Date of Patent: May 27, 2014

(54) ELECTROMECHANICAL SENSOR APPARATUS AND METHODS WITH MULTISENSING ASPECTS

(75) Inventors: Padraig O'Mahony, San Jose, CA (US); Frank Caris, San Jose, CA (US); Theo Kersjes, Newberg, OR (US); Christian Paquet, Cupertino, CA (US)

(73) Assignee: NXP, B.V., Eindhovenee (NL)

( * ) Notice: Subject to any disclaimer, the term of this patent is extended or adjusted under 35 U.S.C. 154(b) by 1522 days.

(21) Appl. No.: 11/721,029

(22) PCT Filed: Dec. 6, 2005

(86) PCT No.: PCT/IB2005/054085
§ 371 (c)(1),
(2), (4) Date: May 6, 2009

(87) PCT Pub. No.: WO2006/061781
PCT Pub. Date: Jun. 15, 2006

(65) Prior Publication Data
US 2009/0211359 A1 Aug. 27, 2009

Related U.S. Application Data

(60) Provisional application No. 60/633,932, filed on Dec. 6, 2004.

(51) Int. Cl.
*H01L 21/00* (2006.01)

(52) U.S. Cl.
USPC ............................................. 438/50; 438/67

(58) Field of Classification Search
USPC .............. 257/787, E29.324, E21.613, 55, 59, 257/254, 415, 416, 417; 73/510; 438/50, 438/52, 59, 64, 66, 74, 67
See application file for complete search history.

(56) References Cited

U.S. PATENT DOCUMENTS

| | | | | |
|---|---|---|---|---|
| 6,122,964 | A * | 9/2000 | Mohaupt et al. | 73/514.32 |
| 6,504,385 | B2 | 1/2003 | Hartwell et al. | |
| 6,539,101 | B1 * | 3/2003 | Black | 382/124 |
| 2003/0090737 | A1 | 5/2003 | Silverbrook et al. | |
| 2004/0183214 | A1 * | 9/2004 | Partridge et al. | 257/787 |

FOREIGN PATENT DOCUMENTS

| | | |
|---|---|---|
| CN | 1389704 A | 1/2003 |
| EP | 1460038 A2 | 9/2004 |
| WO | 0122351 A1 | 3/2001 |
| WO | 0122651 A2 | 3/2001 |

* cited by examiner

Primary Examiner — Selim Ahmed

(57) ABSTRACT

One embodiment of the present application includes a multi-sensor assembly. This assembly has an electromechanical motion sensor member defined with one wafer layer, a first sensor carried with a first one or two or more other wafer layers, and a second sensor carried with a second one of the other wafer layers. The one wafer layer is positioned between the other wafer layers to correspondingly enclose the sensor member within a cavity of the assembly.

29 Claims, 2 Drawing Sheets

ELECTROMECHANICAL SENSOR APPARATUS AND METHODS WITH MULTISENSING ASPECTS

The present invention relates to sensors for electronic systems, and more particularly, but not exclusively, relates to an assembly of multiple sensors including at least one microelectromechanical system (MEMS) sensor type.

Sensors have become a more prominent feature in electronic devices. For example, various sensors have become commonplace in mobile telephones, personal digital assistants (PDAs), and the like. One particular sensor type is based on microelectromechanical system (MEMS) technology. MEMS encompass micron-sized mechanics and electronics combined on a single wafer die, piece or chip, as well as three-dimensional devices with one or more operational mechanical members on dimension on the micron scale. MEMS-based sensors are directed to a wide array of applications, being capable of sensing parameters such as motion, air, light, liquid, or the like. In addition, MEMS technology has expanded beyond typical silicon wafer origins to other materials. Likewise, MEMS fabrication techniques have expanded beyond those typical of the semiconductor industry.

Unfortunately, MEMS devices generally require a protective enclosure to assure reliable performance. This requirement has led to a relatively large consumption of coveted device "real estate." A tradeoff between operational capability and device size often results. Thus, there is an ongoing need for further contributions in this area of technology.

One embodiment of the present application is a unique sensing device. Other embodiments include unique methods, systems, devices, and apparatus to provide sensors.

A further embodiment of the present application includes providing a first sensor formed from a first layer of material and a second sensor formed from a second layer of material. Also, a MEMS-based device is formed from a third layer of material. At least a portion of this device is enclosed between the first layer and the second layer to provide a multisensor assembly. In one form, each layer corresponds to a different wafer member. As used herein, "wafer member" refers to a wafer of any type or composition or any wafer piece, part, die, or the like separated or otherwise derived from a larger wafer. As used herein, "MEMS device" specifically refers to any mechanical component that includes at least one three-dimensional (3D) lithographic feature having a smallest dimension of one millimeter of less. The 3D features of MEMS devices typically include various geometries that range in size from one micrometer (one millionth of a meter) to a millimeter (one thousand of a meter), and they are typically manufactured, at least in part, using planar processing common to semiconductor photolithography. Use of the terms "MEMS" and "device" in a manner other than together in "MEMS device" is intended to have the ordinary meaning attributed to each of these terms individually.

Another embodiment of the present application includes: making a first sensor carried with a first wafer member and a second sensor carried with a second wafer member, forming an electromechanical device from a third wafer member, and at least partially enclosing this device by joining the first wafer member to the third wafer member and the second wafer member to the third wafer member to provide a multisensor assembly.

Still another embodiment includes providing a first sensor from a first layer of material and a second sensor from a second layer of material; where the first sensor detects a different characteristic than the second sensor. Also included is forming an electromechanical device, such as a motion detector, from a third layer and attaching the third layer to the first layer and the second layer. By this attachment, the third layer is positioned between the first layer and the second layer to at least partially enclose the electromechanical device.

Yet another embodiment includes: means for sensing a first characteristic corresponding to a first wafer layer, means for sensing a second characteristic corresponding to a second wafer layer, and a microelectromechanical motion detector. Also included are means for sealing at least a portion of this detector between the first wafer layer and the second wafer layer.

Still a further embodiment of the present application includes: providing a first sensor from a first layer of material and a second sensor from a second layer of material that each sense different characteristics, forming an microelectromechanical motion detector, and sealing at least a portion of the detector between the first layer and the second layer to provide a multisensor assembly.

One object of the present application is to provide a unique sensing device.

Other objects include unique methods, systems, devices, and apparatus to provide sensors.

Further objects, embodiments, forms, aspects, benefits, advantages, and features of the present application and its inventions will become apparent from the figures and description provided herewith.

Figure 1:
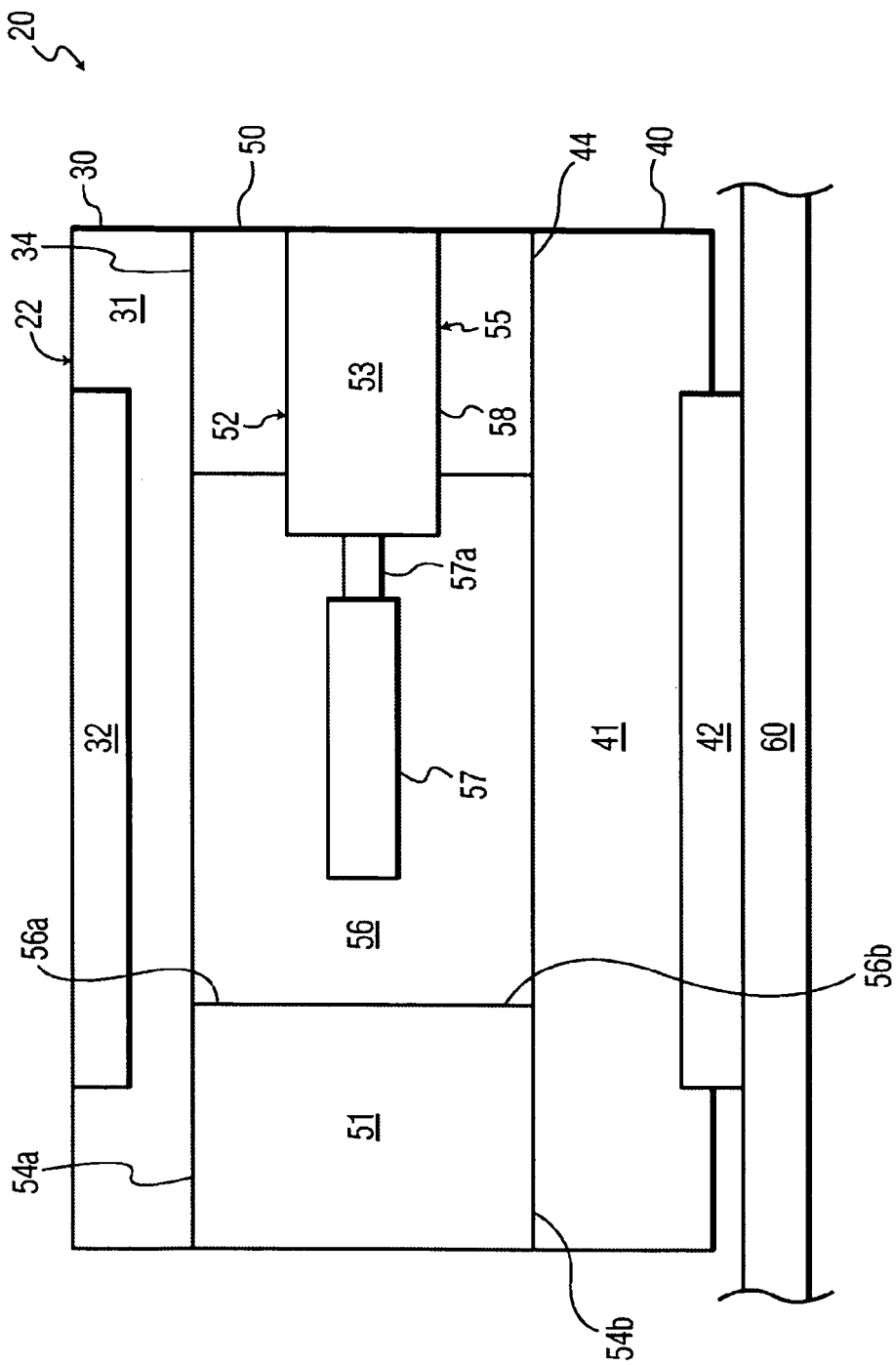
FIG. 1 is a schematic view of a multisensor assembly implemented with multiple wafer members.

For the purpose of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

FIG. 1 schematically depicts electronic multisensor assembly 20 of one embodiment of the present invention. Assembly 20 includes multiple sensor device 22 comprised of wafer members 30, 40, and 50. Typically, wafer members 30, 40, and 50 are each provided as a corresponding die formed by dividing a larger wafer in an earlier processing stage, as will be more fully described in connection with the flowchart of FIG. 3 hereinafter. Wafer members 30, 40, and 50 each define a respective wafer or material layer 31, 41, and 51 of assembly 20. Layer 51 includes opposing sides 54a and 54b that are attached to layers 31 and 41 at boundaries 34 and 44, respectively. Device 22 is mounted to substrate 60. Substrate 60 is only partially shown in FIG. 1.

In one embodiment, wafer members 30, 40, and 50 of device 22 are each comprised of a standard semiconductor material. As an addition or alternative to standard semiconductor materials, in other embodiments any of wafer members 30, 40, and/or 50 can be comprised of a polymer, ceramic, and/or metal, to name just a few examples. In still other embodiments, the composition of wafer member 30, 40, and/or 50 can otherwise vary as would occur to one skilled in the art.

Wafer member 30 includes finger print reader sensor 32, and wafer member 40 includes a joystick movement sensor 42. With this arrangement, sensor 32 is conveniently positioned for direct or indirect engagement with a finger to read a corresponding finger print due to its location opposite substrate 60, while sensors 42 and 52 do not need to be positioned for such engagement. It should be appreciated that one or more other electronic devices, components, sensors, circuits or the like could be formed on wafer member 30, wafer member 40, or both. Wafer member 50 includes a MEMS device in the form of electromechanical motion sensor 52. For the depicted embodiment, sensor 52 is in the form of accelerometer 55. Accelerometer 55 includes base portion 53 adjacent cavity 56. Cavity 56 extends through wafer member 50 defining aperture 56a in side 54a and aperture 56b in side 54b. Accelerometer 55 further includes sensor member 57 in the form of mechanical arm 57a coupled to base 53. Mechanical arm 57a extends from base 53 into cavity 56, and is free to flex and/or otherwise move therein to electromechanically generate an electronic signal with sensor 52 corresponding to acceleration. Alternatively or additionally, one or more different MEMS devices or other device types, components, members, and/or circuitry could be made from wafer member 50 in other embodiments. It should be appreciated that sensor member 57 is enclosed in cavity 56 by covering apertures 56a and 56b with wafer members 30 and 40, respectively. Wafer members 30 and 40 are joined to wafer member 50 to provide a hermetic seal that protects member 57 from damage by a source external to cavity 56.

When left exposed, mechanical workings of MEMS apparatus are typically sensitive to damage or otherwise may perform undesirably. Accordingly, wafer members 30 and 40 provide a protective seal to reduce, if not eliminate, undesired exposure of internal workings. Concomitantly, because wafer members 30 and 40 also include corresponding sensors 32 and 42, the space occupied by the MEMS device (sensor 52) is vertically shared with sensors 32 and 42. The resulting device 22 and assembly 20 can be utilized in a manner that occupies less space compared to a configuration that as uses one or more of the sensors separately. It should be appreciated that in alternative embodiments, more or fewer sensors may be assembled together in accordance with the teachings of the present application. In one other embodiment, only one side 54a or 54b of wafer member 50 includes an aperture exposing sensor 52 for which only one corresponding wafer member 30 or 40 may be attached to wafer member 50 to provide a protective enclosure.

Figure 2:
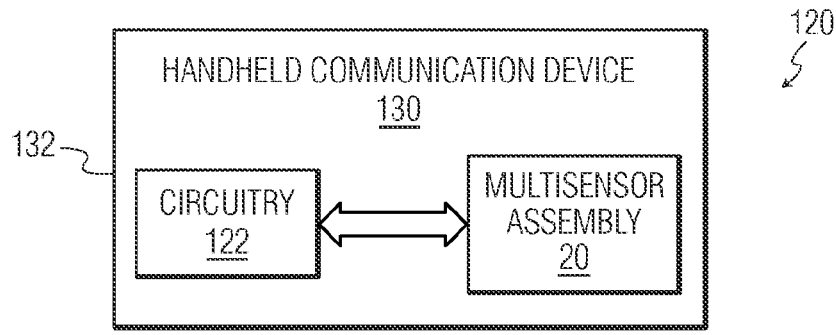
FIG. 2 is a system including the assembly of FIG. 1.

Referring additionally to FIG. 2, system 120 is depicted; where like reference numerals refer to like features. System 120 includes handheld communication device 130 in the form of a mobile (or cellular) telephone 132. Device 130 includes multisensor assembly 20 and circuitry 122. Circuitry 122 is electrically coupled to multisensor assembly 20. Circuitry 122 is arranged to provide electrical power to sensor 32, sensor 42, and/or sensor 52 as needed or desired. Furthermore, circuitry 122 is configured to receive detection signals from sensors 32, 42, and 52; and utilize such signals as desired in the operation of device 130.

For the depicted mobile telephone 132, sensor 32 can be utilized as a security measure. In this example, a fingerprint identification signal determined via sensor 32 is required to utilize some or all of the functionality of telephone 132 with or without other contingencies. Further, sensor 42 can be utilized to implement a joystick-controlled display pointer or cursor for telephone 132 (not shown) or the like. Sensor 52 can be used for a location-reporting operation of telephone 132. In one particular embodiment, signals from sensor 52 are used to augment a primary Geosynchronous Positioning Satellite (GPS) locating subsystem to accommodate poor GPS reception or the like. Nonetheless, in other embodiments, one or more of sensors 32, 42, and 52 can be utilized in a different functional capacity for telephone 132 and/or may be of a different sensor type altogether. In still other embodiments, assembly 22 is utilized in another device type, such as a Personal Digital Assistant (PDA), a personal computer (notebook, laptop, or otherwise), an electronic game device, an electronic operator control or input device, and/or such different device as would occur to one skilled in the art.

Figure 3:
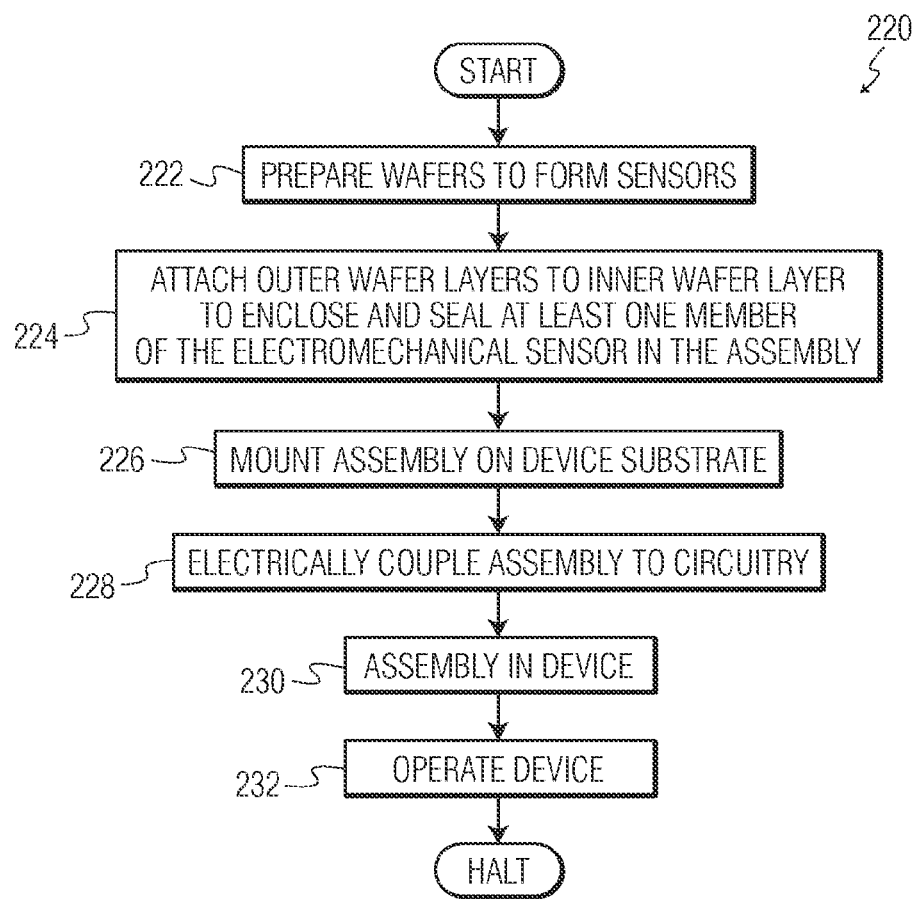
FIG. 3 is a flowchart of one procedure for making a device including the assembly of FIG. 1.

FIG. 3 depicts manufacturing procedure 220 in flowchart form. Procedure 220 is one mode of making a device that includes assembly 22. Procedure 220 starts with operation 222. In operation 222, each wafer member 30, 40, and 50 is processed to provide the corresponding sensor 32, 42, 52 that each carry. Each of wafer members 30, 40, 50 is processed by standard techniques including selective doping, etching, metalization, and/or various lithographic or different fabrication techniques desired to provide the respective sensor 32, 42, and 52. In one particular embodiment, member 57 of wafer member 50 is formed by standard etching techniques, which leaves cavity 56 surrounding it. In one approach directed to mass manufacturing, each of wafer members 30, 40, and 50 is provided as a wafer die that results from separating a larger corresponding wafer into a number of pieces (dice) or "chips." For a given larger wafer that is separated, each die (wafer member) carries the same type of sensor 32, 42, or 52. Accordingly, for this form, the larger wafer can provide multiple sensors of the same type and three different larger wafers can be used to respectively make several of each type of wafer member 30, 40, and 50 (and correspondingly sensors 32, 42, and 52).

Procedure 220 proceeds from operation 222 to operation 224. In operation 224, wafer member 30 and wafer member 40 resulting from operation 222 are attached on side 54a and side 54b of wafer member 50, respectively. This attachment at boundary 34 and/or boundary 44 can be by bonding with an adhesive or the like, fusing, and/or a different joining technique as would occur to one skilled in the art. In one embodiment, operation 224 results in a hermetic seal to protect accelerometer 55—especially member 57; however, in other embodiments, the attachment need not provide such a seal.

From operation 224, procedure 220 continues with operation 226. In operation 226, wafer member 40 is mounted on substrate 60 using standard techniques. Substrate 60 can be a semiconductor, metal, ceramic, a polymeric material and/or of a different composition as would occur to one skilled in the art. In still other embodiments, substrate 60 is absent. Procedure 220 continues with operation 228. In operation 228, assembly 20 is electrically coupled to circuitry of which circuitry 122 is just one nonlimiting example. The resulting configuration is assembled into the application device in operation 230. This device may be a handheld communication device 130 or such different device as would occur to one skilled in the art. In operation 232, the application device is operated. Operation 232 can be performed to test device functionality and/or as a consequence of using the device. It should be appreciated that procedure 220 is just one of many manufacturing processes for device 22, multisensor assembly 20, and systems including such items.

While the invention has been illustrated and described in detail in the drawings and foregoing description, the same is to be considered as illustrative and not restrictive in character, it being understood that only selected embodiments have been shown and described and that all changes, modifications and equivalents that come within the spirit of the inventions described heretofore and/or defined by the following claims are desired to be protected.

What is claimed is:

1. A method, comprising:

making a first sensor carried with a first wafer member and a second sensor carried with a second wafer member;

forming an electromechanical sensor from a third wafer member, the third wafer member having a first side opposite a second side, and the electromechanical sensor including a sensor member extending into a cavity and configured and arranged to flex within the cavity and generate an electronic signal in response to the flexing; and enclosing the sensor member by joining the first wafer member to the first side of the third wafer member and the second wafer member to the second side of the third wafer member to provide a multisensor assembly.

2. The method of claim 1, wherein the first sensor is a fingerprint detector.

3. The method of claim 2, wherein the second sensor is a joystick movement detector.

4. The method of claim 1, wherein the electromechanical sensor is a motion detector.

5. The method of claim 4, wherein the motion detector is an accelerometer in the form of a microelectromechanical system (MEMS) device and the electronic signal corresponds to an acceleration.

6. The method of claim 1, which includes mounting the multisensor assembly to a substrate.

7. The method of claim 1, which includes electrically connecting the multisensor assembly to circuitry a handheld electronic device.

8. The method of claim 7, wherein the handheld device includes a mobile telephone carrying the circuitry and the multisensor assembly.

9. The method of claim 1, wherein the sensor is an accelerometer, the cavity extends through the first side and the second side of the third wafer member, and the enclosing includes sealing the sensor member between the first wafer member and the second wafer member in the cavity.

10. A method, comprising:

providing a first sensor from a first layer of material and a second sensor from a second layer of material, the first sensor detecting a different characteristic than the second sensor;

forming an electromechanical motion detector from a third layer of material; and attaching the third layer to the first layer and the second layer, the third layer being positioned between the first layer and the second layer after said attaching to at least partially enclose and seal a portion of the electromechanical motion detector in a cavity extending through a first side and a second side of the third layer of material and enclosed by the first layer and the second layer to provide a multisensor assembly.

11. The method of claim 10, wherein the first sensor is a fingerprint detector.

12. The method of claim 11, wherein the second sensor is a joystick movement detector.

13. The method of claim 10, wherein the electromechanical motion detector is an accelerometer.

14. The method of claim 10, wherein the first sensor is a fingerprint detector, the second sensor is a joystick movement detector, and the electromechanical motion detector is an accelerometer of a microelectromechanical system (MEMS) device type, and further comprising:

providing the first layer from a first wafer member, the second layer from a second wafer member, and the third layer from a third wafer member;

wherein the portion of the electromechanical motion detector is a sensor member of the accelerometer; and connecting the multisensor assembly to circuitry for a handheld electronic device.

15. The method of claim 14, wherein the handheld device includes a mobile telephone carrying the circuitry and the multisensor assembly.

16. An apparatus, comprising: a multisensor assembly including:

an electromechanical sensor formed in a cavity defined with one wafer layer, the electromechanical sensor including a mechanical arm extending into the cavity and configured and arranged to flex in the cavity and generate an electronic signal in response to the flexing;

a first other sensor including a first one of at least two or more other wafer layers;

a second other sensor including a second one of the other wafer layers; and wherein the one wafer layer is positioned between the first one of the other wafer layers and the second one of the other wafer layers, the electromechanical sensor being enclosed between the first one of the other wafer layers and the second one of the other wafer layers, the first and second other wafer layers being configured and arranged to seal a portion of the electromechanical sensor in the cavity.

17. The apparatus of claim 16, further comprising a mobile phone carrying the multisensor assembly and circuitry electrically coupled to the multisensor assembly.

18. The apparatus of claim 16, wherein the first other sensor is a fingerprint detector.

19. The apparatus of claim 18, wherein the second other sensor is a joystick movement detector.

20. The apparatus of claim 19, wherein the one wafer layer defines the electromechanical sensor and the electronic signal generated by the mechanical arm corresponds to acceleration.

21. The apparatus of claim 20, further comprising means for sealing the sensor member between the first wafer layer and the second wafer layer.

22. A multisensor assembly, comprising:

means for sensing a first characteristic carried with a first wafer layer;

means for sensing a second characteristic carried with a second wafer layer; and a microelectromechanical system (MEMS) device including a sensor member, wherein the first wafer layer and the second wafer layer are configured and arranged to seal the sensor member in a cavity between the first wafer layer and the second wafer layer, and the sensor member extends into the cavity and is configured and arranged to flex in the cavity and generate an electronic signal in response to the flexing, wherein the sensor member having an end portion and an arm portion being more narrow in width and more distal to a center of the cavity than the end portion and the arm portion being configured and arranged to facilitate the flex within the cavity.

23. A method for forming a multisensory assembly, the method comprising:

providing a first sensor apparatus including a first sensor and a first wafer member, and a second sensor apparatus including a second sensor and a second wafer member, the first sensor sensing a different characteristic than the second sensor;

forming an electromechanical motion sensor from a third wafer member, the electromechanical motion sensor including one or more sensor members in a cavity that extends through a first side and a second side of the third layer; and sealing at least the one or more members in the cavity between the first wafer member and the second wafer member to provide the multisensor assembly and protect the one or more sensor members in the cavity.

24. The method of claim 23, wherein the electromechanical motion sensor is an accelerometer.

25. The method of claim 24, wherein the first sensor is a fingerprint sensor.

26. The method of claim 25, wherein the second sensor is a joystick movement detector.

27. The method of claim 23, wherein the forming includes making the electromechanical motion sensor from a wafer layer, the wafer layer at least partially defines the cavity, and the sealing includes attaching the wafer layer to the first wafer member and the second wafer member, and wherein the sensor member includes an end portion and an arm portion being more narrow in width and more distal to a center of the cavity than the end portion and the arm portion being configured and arranged to facilitate the flex within the cavity.

28. The method of claim 27, which includes:
coupling the multisensor assembly to circuitry; and
placing the circuitry and the multisensor assembly in a mobile telephone.

29. The method of claim 1, wherein the first wafer member and the second wafer member are configured and arranged to seal the sensor member in the cavity, and wherein the sensor member includes an end portion and an arm portion being more narrow in width and more distal to a center of the cavity than the end portion and the arm portion being configured and arranged to facilitate the flex within the cavity.

* * * * *